US012707602B2

(12) United States Patent
Sun et al.

(10) Patent No.: US 12,707,602 B2
(45) Date of Patent: Aug. 11, 2026

(54) HETEROGENOUS MULTI-LAYER STRUCTURE

(71) Applicant: Tesla, Inc., Austin, TX (US)

(72) Inventors: Shishuang Sun, Cupertino, CA (US); Ganesh Venkataramanan, Sunnyvale, CA (US); Yang Sun, Palo Alto, CA (US); Jin Zhao, San Jose, CA (US); Shaowei Deng, Palo Alto, CA (US); William Chang, Palo Alto, CA (US); Mengzhi Pang, Cupertino, CA (US); Steven Butler, Palo Alto, CA (US); William A McGee, San Jose, CA (US); Aydin Nabovati, Toronto (CA)

(73) Assignee: Tesla, Inc., Austin, TX (US)

( * ) Notice: Subject to any disclaimer, the term of this patent is extended or adjusted under 35 U.S.C. 154(b) by 127 days.

(21) Appl. No.: 18/683,408

(22) PCT Filed: Aug. 16, 2022

(86) PCT No.: PCT/US2022/040508
§ 371 (c)(1),
(2) Date: Feb. 13, 2024

(87) PCT Pub. No.: WO2023/023089
PCT Pub. Date: Feb. 23, 2023

(65) Prior Publication Data

US 2024/0357769 A1 Oct. 24, 2024

Related U.S. Application Data

(60) Provisional application No. 63/260,393, filed on Aug. 18, 2021.

(51) Int. Cl.
*H05K 7/20* (2006.01)

(52) U.S. Cl.
CPC .................................. *H05K 7/205* (2013.01)

(58) Field of Classification Search
CPC ......... H01L 23/473; H01L 2225/06589; H01L 25/0657; H01L 2225/06517;
(Continued)

(56) References Cited

U.S. PATENT DOCUMENTS 7,196,411 B2 * 3/2007 Chang ................ H01L 25/0652 257/713
10,064,287 B2 * 8/2018 Standing ............... H05K 1/141
(Continued)

OTHER PUBLICATIONS

International Search Report and Written Opinion mailed Dec. 9, 2022 in International Application No. PCT/US2022/040508, in 11 pages.

(Continued)

*Primary Examiner* — Michael A Matey
(74) *Attorney, Agent, or Firm* — Knobbe, Martens, Olson & Bear, LLP

(57) ABSTRACT

The systems, methods, and devices disclosed herein relate to a multi-layer structures arranged in a vertically orientation. In some embodiments, a computing assembly can include a first cooling system, a first electronics layer, a second cooling system, and a second electronics layer. The first cooling system can be disposed on top of and can be in thermal communication with the first electronics layer. The first electronics layer array includes an array of integrated circuit dies that are in electronic communication with each other in a plane that is orthogonal to power delivery. The first electronics layer can be disposed on top of and can be in thermal communication with the second cooling system, and the second cooling system can be disposed on top of and can be in thermal communication with the second electronics layer. The second electronics layer includes an array of
(Continued)

power delivery modules. In some embodiments, at least one layer can use system on wafer packaging.

20 Claims, 5 Drawing Sheets

(58) Field of Classification Search
CPC ........... H01L 2224/73253; H01L 24/16; H01L 2225/06513; H01L 23/367; H01L 25/0652; H01L 2225/06541; H01L 25/0655; H01L 21/4882; H01L 23/3677; H01L 2924/14; H01L 2225/1094; H01L 23/373; H01L 2225/06548; H01L 21/486; H01L 25/117; H01L 23/3672; H01L 23/3738; H01L 23/5226; H01L 23/5389; H01L 23/5383; H01L 21/3081; H01L 23/50; H05K 7/20254; H05K 7/2039; H05K 1/144; H05K 1/181; H05K 7/205; H05K 7/20509; H05K 1/0209; H05K 1/141; H05K 7/20218; H05K 7/20281; H05K 1/0203; H05K 1/0204; H05K 1/0272; H05K 1/14; H05K 2201/041; H05K 2201/043; H05K 2201/066; H05K 2201/10598; H05K 3/0061; H05K 3/32; H05K 7/02; H05K 7/023; H05K 7/20263; H05K 7/209; G06F 1/20; G06F 2200/201; G06F 1/26; F28D 2021/0029
See application file for complete search history.

(56) References Cited

U.S. PATENT DOCUMENTS

| | | | | |
|---|---|---|---|---|
| 10,481,651 | B2 * | 11/2019 | Dede | G06F 1/26 |
| 10,923,412 | B2 * | 2/2021 | Fricker | H01L 23/3732 |
| 11,145,530 | B2 * | 10/2021 | Fricker | G06T 7/001 |
| 11,915,996 | B2 * | 2/2024 | Sankman | H01L 25/105 |
| 12,087,108 | B2 * | 9/2024 | Byun | G07C 5/085 |
| 2008/0218970 | A1 * | 9/2008 | Kehret | H05K 7/20254 361/699 |
| 2010/0091447 | A1 * | 4/2010 | Jaggers | G06F 1/20 361/679.47 |
| 2010/0187683 | A1 * | 7/2010 | Bakir | H01L 23/53276 257/713 |
| 2012/0001341 | A1 * | 1/2012 | Ide | H01L 23/40 257/773 |
| 2016/0056089 | A1 * | 2/2016 | Taniguchi | H01L 21/30625 438/456 |
| 2017/0186728 | A1 * | 6/2017 | Chainer | H01L 23/473 |
| 2020/0126890 | A1 * | 4/2020 | Singh | H01L 23/427 |
| 2020/0286858 | A1 * | 9/2020 | Fricker | H05K 1/181 |
| 2020/0381330 | A1 * | 12/2020 | Chiu | H05K 1/144 |
| 2021/0092878 | A1 * | 3/2021 | Gao | H05K 7/20254 |
| 2025/0087557 | A1 | 3/2025 | Nabovati et al. | |

OTHER PUBLICATIONS

Chun et al., "InFO_SoW (System-on-Wafer) for High Performance Computing", 2020 IEEE 70$^{th}$ Electronic Components and Technology Conference (ECTC), Jun. 1, 2020, pp. 1-6.

* cited by examiner

HETEROGENOUS MULTI-LAYER STRUCTURE

CROSS-REFERENCE TO RELATED APPLICATION

This application is a U.S. national phase application under 35 U.S.C. § 371 of International Application No. PCT/US2022/040508, titled "HETEROGENOUS MULTI-LAYER STRUCTURE," and filed Aug. 16, 2022, which claims the benefit of U.S. Provisional Patent Application No. 63/260,393, titled "HIGH DENSITY MULTI-STAGE ARRAY BASED VERTICAL INTEGRATED POWER SOLUTION FOR DISTRIBUTED COMPUTING APPLICATION," filed Aug. 18, 2021, the disclosures of each of which are hereby incorporated herein by reference in their entireties and for all purposes.

BACKGROUND

Technical Field

This disclosure relates to electronic assemblies, and more specifically to electronic assemblies for increasing integrated circuit die density.

Description of Related Technology

High performance computing systems are important for many applications. However, conventional computing system designs can face significant cooling challenges and can use space inefficiently, which can lead to reduced performance, increased physical space requirements, and so forth.

High performance computing applications such as artificial intelligence, machine learning, and data mining can benefit from high computing density. For example, locating computing dies near one another can reduce the physical space occupied for a particular computing capacity, can improve communication bandwidth and latency between dies, and so forth. Packaging techniques such as System on Wafer (SoW) have made it feasible to build higher density computing systems attempting to mitigate area in between dies. Traditionally, dies corresponding to central processing unit (CPU) implementations are integrated into some form of printed circuit board (PCB) that includes various components, such as network components/interconnects, cooling systems, etc. In such implementations are arranged on the PCB horizontally and co-planar with the die. Such horizontally planar implementations can often limit the density in which dies may be combined, such as in SOW implementations.

BRIEF DESCRIPTION OF THE DRAWINGS

This disclosure is described herein with reference to drawings of certain embodiments, which are intended to illustrate, but not to limit, the present disclosure. It is to be understood that the accompanying drawings, which are incorporated into and constitute a part of this specification, are for the purpose of illustrating concepts disclosed herein and may not be to scale.

DETAILED DESCRIPTION OF THE PREFERRED EMBODIMENT

Figure 1:
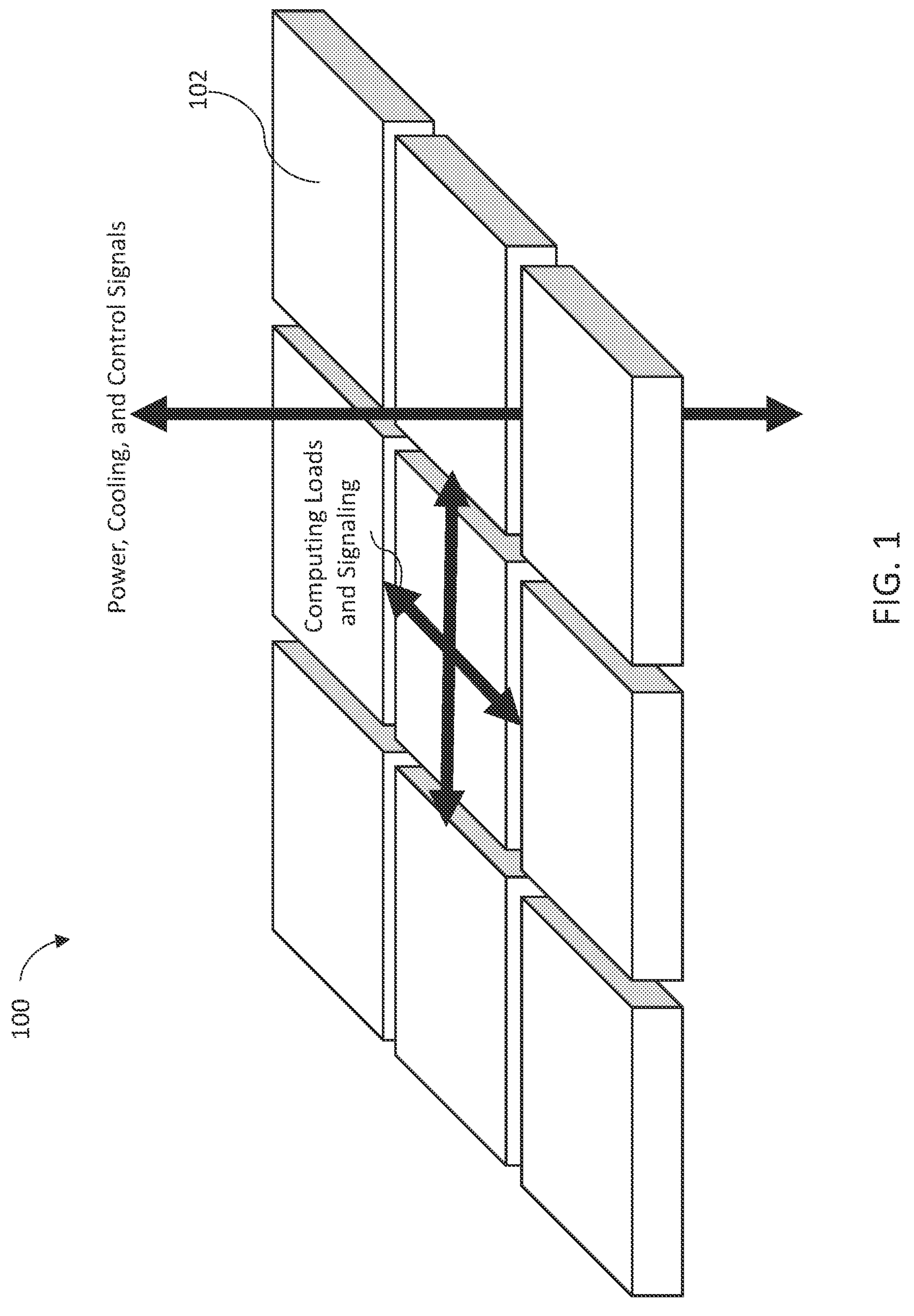
FIG. 1 is a schematic diagram which shows an example of an array of integrated circuit dies assemblies and power, cooling and control signals running perpendicular to computing loads and signaling.

The following description of certain embodiments presents various descriptions of specific embodiments. However, the innovations described herein may be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments may include more elements than illustrated in a drawing and/or a subset of the elements illustrated in a drawing. Further, some embodiments may incorporate any suitable combination of features from two or more drawings.

When computing dies are very close together, it may be advantageous to configure a system such that some components are vertically arranged. For example, power delivery, control circuitry, and so forth may be located below the dies, and power and cooling can be delivered vertically while signals and computing loads travel horizontally from die to die in an array. In some cases, an array of dies and associated power, control, and cooling hardware can be assembled into a computing assembly, and computing assemblies may be placed near (e.g., next to) each other with little space in between. In some embodiments, computing assemblies may be configured with high-speed communications interfaces to enable computing assemblies to communicate with each other. Thus, while in a conventional computing system where density is not a major concern or where only one or a few CPU dies may be present, horizontal power delivery or cooling solutions with large horizontal areas may be viable. Additionally, in a high-density setting, such as when using SoW or other high density packaging techniques, traditional communication interconnects utilized in horizontally arranged die have more limited bandwidth characteristics, such as the limitations provided by traditional network interconnects.

The present disclosure describes a system architecture/assembly in which various components are arranged in a vertical orientation. The system architecture described herein can be used to create a highly dense computing assembly including at least one electronics layer in which a plurality of individual dies can be combined. Such array structures can help increase computational density by mitigating the area on the mounting surface of the electronics layer, such as a fan out wafer or organic substrate, between the individual dies. Additionally, the mounting surface can further be configured with additional connection components provided on the mounting surface that have higher communication bandwidths, relative to physical interconnects.

In accordance with one or more aspects, systems, methods, and devices are disclosed herein relate to multi-layer structures. In some embodiments, an individual computing assembly can include a first cooling system, a first electronics layer, a second cooling system, and a second electronics layer. The first cooling system can be disposed on top of and can be in thermal communication with the first electronics layer. The first electronics layer array includes an array of integrated circuit dies that are in electronic communication with each other in a plane that is orthogonal to power delivery. The first electronics layer can be disposed on top of and can be in thermal communication with the second cooling system, and the second cooling system can be disposed on top of and can be in thermal communication with the second electronics layer. The second electronics layer includes an array of power delivery modules. In some embodiments, at least one layer can use system on wafer packaging.

FIG. 1 shows an example of an array 100. The array 100 can comprise a plurality of integrated circuit (IC) dies 102, which will be described in greater detail individual with regard to FIGS. 3A-3C and 4. The dies 102 can receive power and/or control signals vertically. The individual components of the dies 102 can be cooled vertically as described herein. The dies 102 can communicate with each other via horizontal communication links 314 (FIG. 3A), which are orthogonal to the transfer of power and cooling as described herein. For example, a SoW layer can include one or more routing layers, for example 4, 5, 6, 8, or 10 routing layers The routing layers can provide signal connectivity between IC dies 102 within the SoW layer or to external components. Illustratively, the interconnects 314 may be of various conductive materials or materials with conductive properties, such as metals (e.g., copper), optical materials, and the like.

In some embodiments, each individual die 102 is arranged in a vertical, multi-layer architecture including a SoW layer, referred to generally as a first electronics layer. Individual SoW layers can include an array of IC dies positioned on a wafer. In some embodiments, the IC dies can include a sensor die, a memory die, an application specific integrated circuit (ASIC) die, a central processing unit (CPU) die, a graphical processing unit (GPU) die, a field programmable gate array (FPGA) die, and/or a microelectromechanical systems (MEMS) die. In some embodiments, the IC dies can communicate with each other within the SoW through a redistribution layer (RDL) formed therein. The RDL layer and/or other electrical connections with the SoW can beneficially provide, for example, a relatively low communication latency between the IC dies, a relatively high bandwidth density, and/or a relatively low power distribution network (PDN) impedance.

It should also be realized that each array 100 may include connections for communicating between a plurality of SoW arrays within a larger system. For example, the array 100 may be part of a system containing 4, 8, 12, 16 or more SoW arrays, each one communicating with each other through connectors located in the same or similar plane as the SoW array. Additionally, although FIG. 1 illustrates an array of nine dies 102 arranged in a 3 by 3 orientation, the number of individual dies 102 that can be combined is not limited to the illustrative number including 4 dies (2 by 2 array); 16 dies (4 by 4 array); 25 dies (5 by 5 array); 36 dies (6 by 6 array), 49 dies (7 by 7 array); and any number of additional array sizes. non-square geometric shapes (e.g., rectangular arrangements) or non-geometric shapes.

Figure 2:
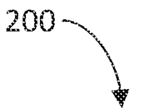
FIG. 2 is a block diagram which shows an example of a conventional prior art implementation of multiple integrated circuit dies implemented on individual printed circuit boards and using interconnection cables.
Figure 2:
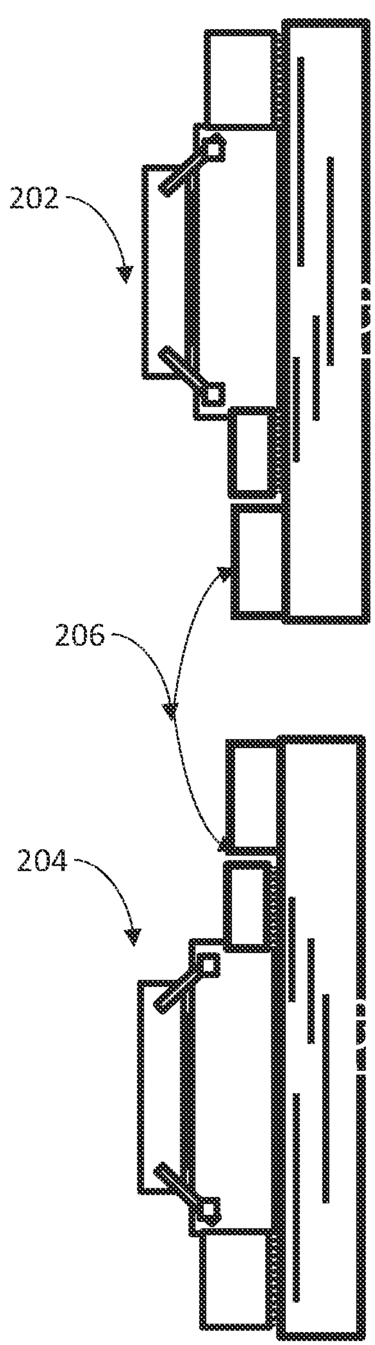

FIG. 2 shows an example of a conventional prior art approach 200 to combination of integrated circuit dies 202, 204. As illustrated in FIG. 2, each individual circuit die 202, 204 is mounted on a PCB substrate and organized such that additional components, including memory, interconnects, power modules, etc. are organized along a common horizontal plane defined by, or otherwise parallel to, the substrate. The individual dies 202, 204 may be in data connectivity via interconnector 206. Illustratively, the flow of data between the integrated dies 202, 204 such that the central processing unit communicates with the connectors via the PCB and the connectors subsequently communicate via the interconnects 206. This type of communication can be bandwidth constraining.

Figure 3B:
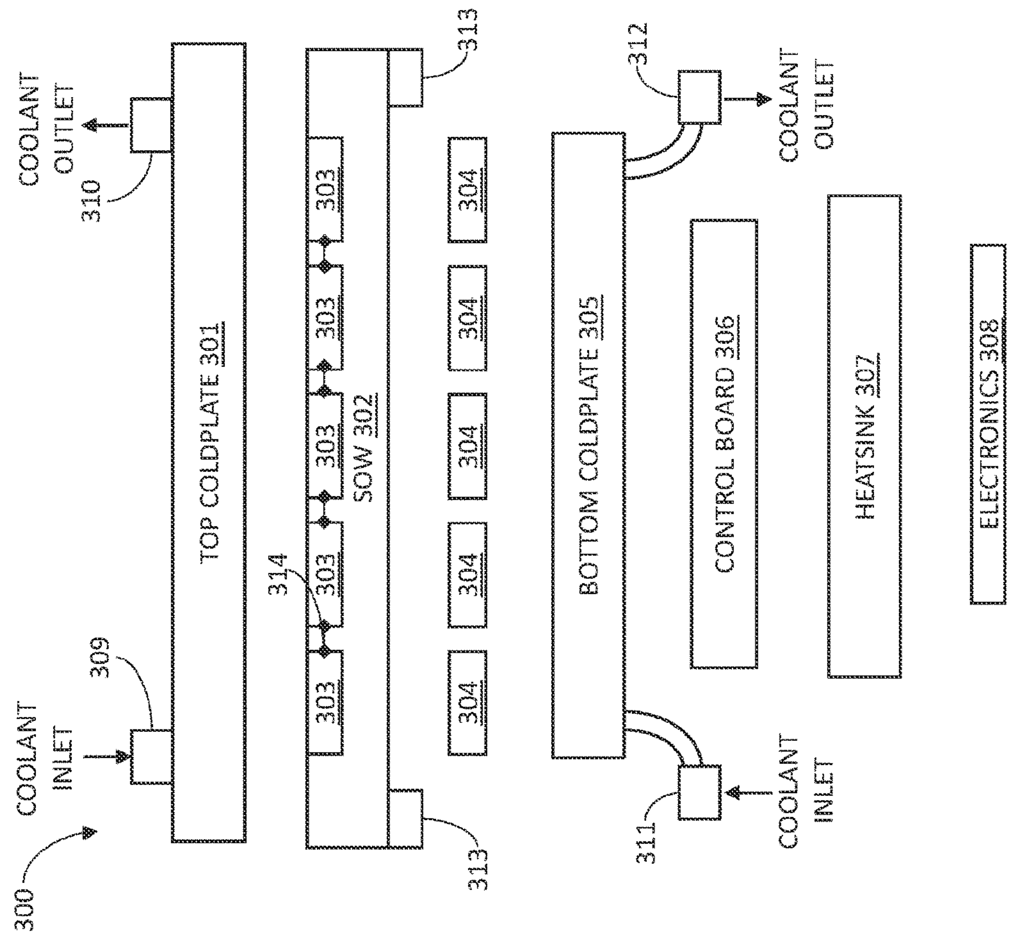
FIG. 3B is an exploded block diagram of an integrated computing assembly showing a multi-layer computing assembly including an array of integrated circuit dies according to one embodiment.
Figure 3A:
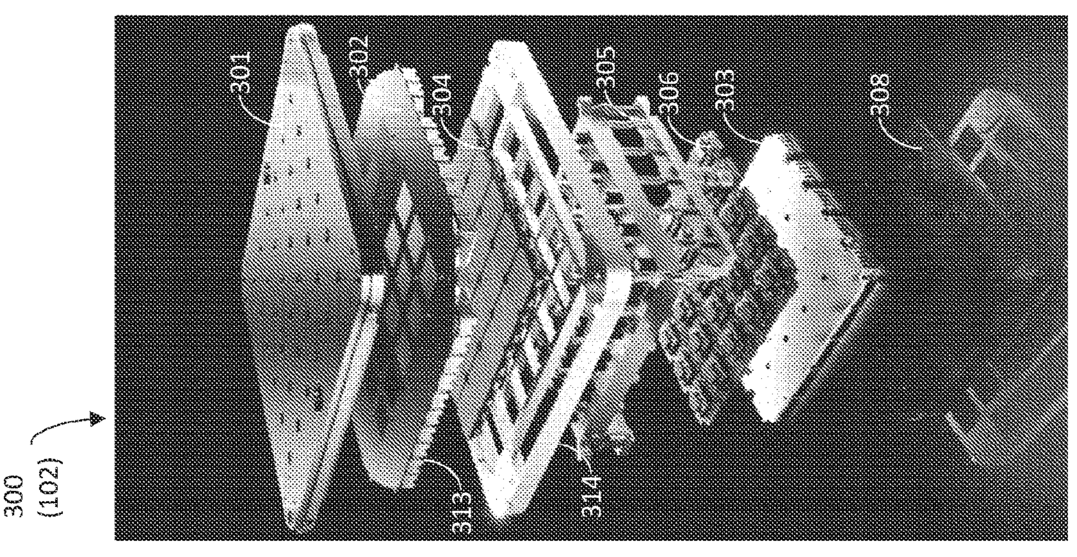
FIG. 3A is a perspective exploded view of a computing assembly comprising a system on wafer layer according to one embodiment.
Figure 3C:
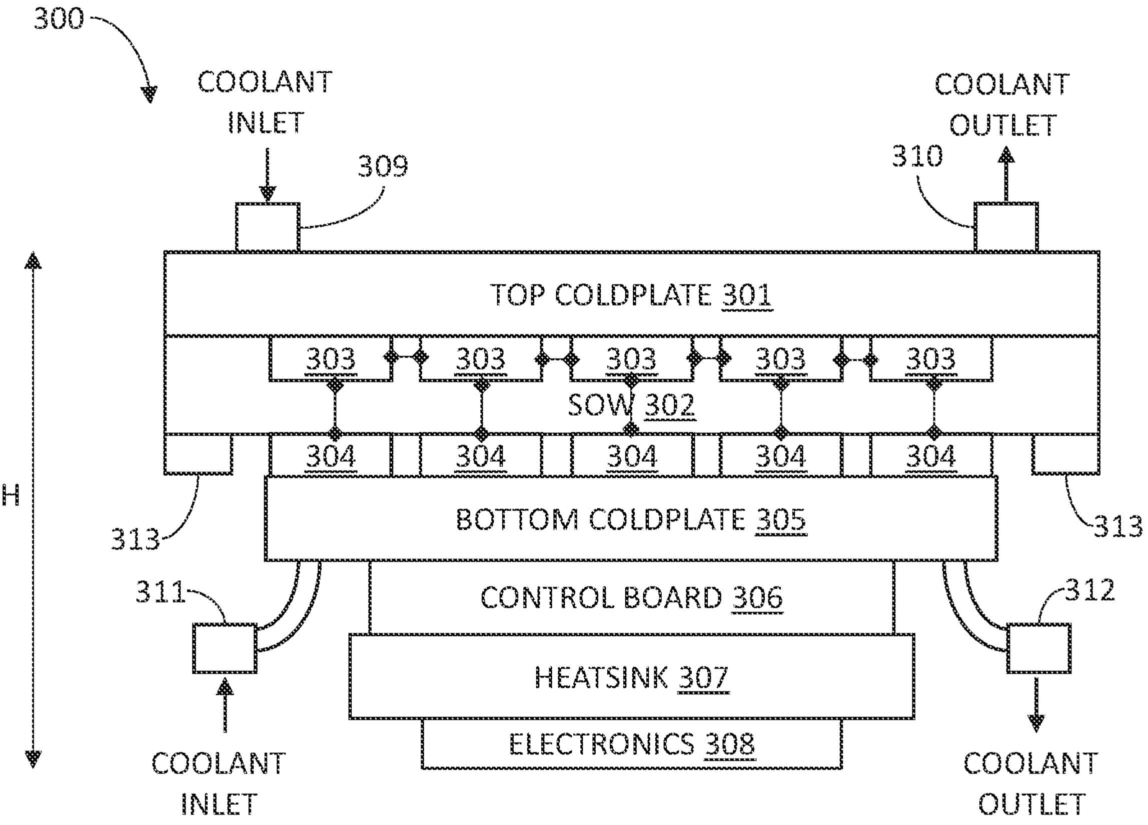
FIG. 3C show an assembled block diagram of the system shown in FIG. 3A comprising a system on wafer layer according to some embodiments.

FIGS. 3A, 3B, and 3C show an example computing assembly 300 including a SoW layer according to some embodiments. By way of example, each die 102 illustrated in FIG. 1 may individually have the corresponding architecture illustrated in FIGS. 3A-3C. An assembly can include a top cold plate 301 that is thermally coupled to a SoW layer 302. The SoW layer 302 can have a plurality of IC dies 303 disposed therein. The SoW layer or first electronics layer may correspond to a variety of substrates, such as wafer fanout packaging, organic substrate panels, silicon interposer and organic substrate, and the like. In some embodiment, the SoW layer 302 may be substantially symmetrical in shape (e.g., a square or square-like shape) to increase the density of the IC dies 303. However, in some embodiments, an arrangement of dies 102 may be implemented in accordance with different arrangements including The SoW layer can also include additional components on the periphery, such as memory components or power components.

As discussed above, the IC dies 303 can communicate with each other via horizontal communication links 314, which are orthogonal to the transfer of power and cooling as described herein. Illustratively, the interconnects 314 may be of various conductive materials or materials with conductive properties, such as metals (e.g., copper), optical materials, and the like.

Below the IC dies 303, the assembly can have a plurality of power delivery modules 304. Each IC die can have a power delivery module associated therewith and can be electrically connected to the associated power delivery module. A bottom cold plate 305 can be thermally coupled to the power delivery modules. The bottom cold plate 305 can also be thermally coupled to a control board 306, which may be used to provide signaling and control functions to the IC dies. The control board can be in thermal contact with a heatsink 307. Additional electronics 308 can be disposed below the heatsink 307.

The top cold plate 301 can have an inlet 309 for flowing liquid coolant into the top cold plate 301 and an outlet 310 for removing heated liquid coolant from the top cold plate 701. The bottom cold plate can have a cooling inlet 311 for receiving liquid content and a coolant outlet 312 for removing coolant from the bottom cold plate 305. The SoW layer 302 can have communication interfaces 313 disposed at the edges of the SoW layer 302. The communication interfaces 313 can be used to connect the SoW layer 302 to neighboring SoW layers in other assemblies.

FIG. 3C is an assembled view of the exploded assembly shown in FIG. 3B. When assembled, the computing assembly can have a vertical height H of from about 1" to about 5", for example about 1", about 2", about 3", about 4", about 5" or any value between these values. The number of layers in a vertical stack is not necessarily limited. Thus, the height of a vertical stack is also not necessarily limited.

Figure 4:
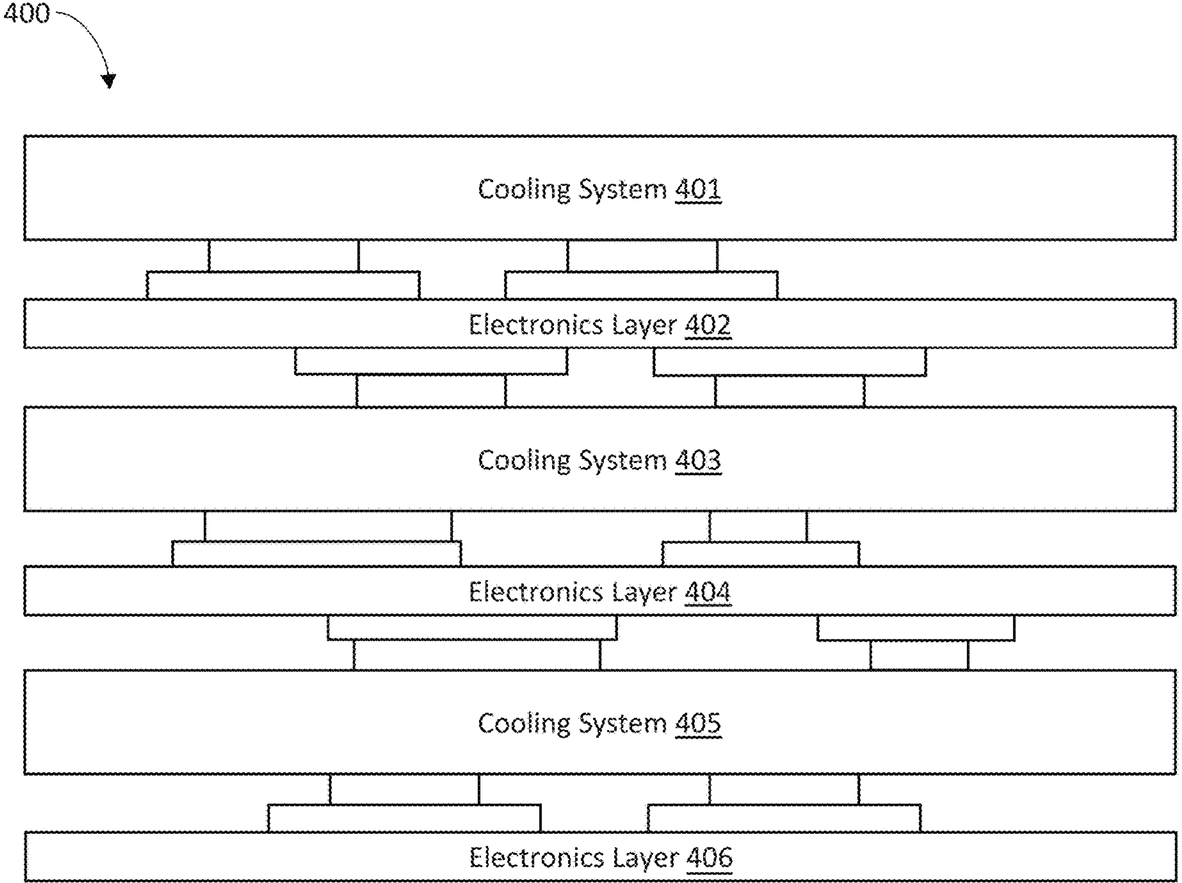
FIG. 4 is a block diagram which shows another example embodiment of a vertical architecture with three cooling systems and three electronics layers according to one embodiment.

FIG. 4 shows another example embodiment of an integrated assembly 400 having multiple layers. As shown in FIG. 4, a cooling system 401 can be thermally coupled on a single side to an electronics layer 402. The electronics layer 402 can be double-sided and can also be in thermal contact with cooling system 403. The bottom side of the cooling system 403 can be thermally coupled to a top surface of a double-sided electronics layer 404. The bottom side of the electronics layer 404 can be thermally coupled with cooling system 405. The bottom surface of the cooling system 405 can be in thermal communication with a single-sided electronics layer 406.

As discussed briefly above, high density computing presents challenges for cooling, power delivery, signaling, and so forth. Density can be increased by stacking components vertically. Effectively cooling a vertical stack of components can present several challenges. For example, some components may output more or less heat than other components, some components may be able to operate at higher or lower temperatures than other components, and so forth. As described herein, some embodiments of a cooling solution can account for differences in cooling requirements for different components to efficiently cool vertically stacked components.

In some embodiments, a high-density computing system can comprise a SoW assembly that includes multiple cooling systems disposed under, on top of, intertwined with, or between electronics layers for efficient, double-sided cooling of heat-generating electronics. Such an architecture may not only provide efficient cooling to the SoW layer and/or other electronics layers but can also provide a high level of mechanical support for enhancing the mechanical integrity of the SoW layer, which can be fragile.

SoW assemblies can include a SoW layer and cooling systems that are integrated or sandwiched into the SoW assembly. The SoW assembly can include an array of IC dies. The IC dies of the SoW assembly can generate significant heat during operation. The cooling systems can dissipate heat generated in the SoW assembly by the IC dies and/or other electronic components within the SoW assembly The systems and methods described herein can be used in processing systems having a high compute density and high communication bandwidth. In some embodiments, a processing system can execute trillions of operations per second in certain applications. In some embodiments, the processing system can be used in or specifically configured for high performance computing and computation-intensive applications, such as neural network processing, machine learning, artificial intelligence, and so forth. In some embodiments, the processing system can implement redundancy. For example, the processing system may include redundant dies, redundant power supplies, redundant storage, or other failover mechanisms that can be used to minimize disruptions in operation. In some embodiments, the processing system can be used in an autopilot system of a vehicle (e.g., an automobile), to implement other autonomous vehicle functionality, to implement Advanced Driving Assistance System (ADAS) functionality, or the like.

In some embodiments, alternating layers of coolers and electronic components can be stacked to form a vertical structure. In some embodiments, components can be cooled from one side (e.g., from top or bottom) or from both sides (e.g., top and bottom). In some embodiments, a cooler can have components on one side (e.g., top or bottom) or on both sides of the cooler. In some embodiments, an electronics layer can be adjacent to another electronics layer without an intervening cooling system. In some embodiments, a cooling system can be adjacent to another cooling system without an intervening electronics layer. Additionally, power to the array of integrated circuit dies can be provided along a vertical axis based on interconnects between individual power supplies in a second electronics layer with individual integrated circuit dies in a first electronics layer.

Stacked structures can present particular challenges for cooling. For example, inlets and outlets for liquid cooling can be difficult to access, and may have limited configuration possibilities due to the lack of space at the sides of a cooling solution to route pipes, hoses, and so forth, especially when stacked structures are placed next to one another. Thus, preferably inlets and outlets are configured to provide vertical coolant delivery and return. In some embodiments, the size (i.e., horizontal dimensions) of layers in a vertical stack can vary from layer to layer. In some embodiments, the horizontal sizing of layers can be limited due to space occupied by cooling lines for other layers, the space occupied by electrical connectors for connecting one computing assembly to a neighboring computing assembly, and so forth.

In some embodiments, a cooling solution can include one or more fans. For example, a cooling solution can include one or more fans disposed at the top and/or bottom of the vertical stack. In some embodiments, one or more fans may be disposed within a vertical stack. In some embodiments, the vertical stack may be installed in a housing or chassis (e.g., a computer enclosure, rack-mounted enclosure, etc.), which may include one or more fans.

In some embodiments, the cooling systems described herein may comprise a material with a relatively high coefficient of thermal expansion (CTE). For example, the cooling system can comprise copper (Cu) and/or Aluminum (Al). In some embodiments, the cooling system can comprise a material that has a CTE in a range of from about 10 ppm/° C. to about 20 ppm/° C. For example, the cooling system can comprise copper with a CTE of about 17 ppm/° C. In some embodiments, a SoW layer can comprise a silicon (Si) wafer. In some embodiments, the SoW layer can comprise a material having a CTE in a range of from about 1 ppm/° C. to about 10 ppm/° C. For example, silicon can have a CTE of about 2.6 ppm/° C. In some embodiments, the CTE of the cooling system can be from about two to about seven times greater than the CTE of the SoW layer.

At least in part because of thermal stresses that can arise due to the differing thermal expansion of components within a stack, components may be prone to premature failure. Thus, it can be important to ensure that components are maintained within temperature ranges that avoid excessive stresses due to non-uniform thermal expansion. In some embodiments, careful alignment of components within the stack can help to alleviate some effects the thermal stresses. For example, a cooler can be centered with respect to the IC dies so that any stresses on a die are uniformly (e.g., substantially uniformly) applied.

In order to obtain desirable power, thermal and connectivity performance, it can be beneficial to align the SoW layer and the cooling systems with a relatively high precision. For example, it can be beneficial to align the SoW layer and the cooling system such that a reference point (e.g., a center point) of the SoW layer aligns with a reference point (e.g., a center point) of the cooling system. In some embodiments, there may be a plurality of alignment markers that can be used to align the SoW layer and the cooling system.

In some embodiments, different electronic components within the vertical stack may include temperature sensors. For example, an IC die can have one or more temperature sensors, power delivery hardware such as VRMs can have one or more temperature sensors, control circuitry can have one or more temperature sensors, and so forth. In some embodiments, temperature data from multiple sensors may be aggregated together at various levels. In some embodiments, the aggregated data may be used for adjusting cooling, such as changing a fan speed, increasing or decreasing a coolant flow rate, and the like. In some embodiments, all the temperature sensors on a particular IC die can be aggregated. In some embodiments, all the temperature sensors in all the IC dies in an SoW layer can be aggregated. In some embodiments, all temperature sensors on power delivery components can be aggregated. In some embodiments, all temperature sensors in a computing assembly can be aggregated. In some embodiments, all temperature sensors in a larger cabinet or structure comprising a plurality of computing assemblies can be aggregated.

In some embodiments, rigidity and mechanical strength can be incorporated into the system. In some embodiments mechanical reinforcement can alternatively or additionally be provided by support layers, such as the support layer 414 shown in FIG. 4A. The support layer 414 can be a structure made of a rigid material such as a metal, plastic, ceramic, and so forth.

What is claimed is:

1. A computing assembly comprising:

a first cooling system;

a first electronics layer having a first surface and a second surface, wherein the first electronics layer comprises an array of integrated circuit dies and wherein the first surface is in thermal communication with the first cooling system;

a second cooling system in thermal communication with the second surface of the first electronics layer; and a second electronics layer having a third surface and a fourth surface, wherein the second electronics layer comprises an array of power delivery modules, wherein each power delivery module of the array of power delivery modules is electrically connected with and configured to supply power to a respective integrated circuit die of the array of integrated circuit dies, and wherein the third surface is in thermal communication with the second cooling system, wherein the second cooling system comprises a first cooling inlet configured to receive a coolant and a first cooling outlet configured to remove the coolant from the second cooling system, and is configured to conduct thermal energy from the array of integrated circuit dies and the array of power delivery modules, wherein the first electronics layer includes conductive materials to interconnect the array of integrated circuit dies.

2. The computing assembly of claim 1, wherein the conductive materials on the first electronics layer correspond to copper conductive material.

3. The computing assembly of claim 1, wherein the conductive materials on the first electronics layer correspond to optical conductive material.

4. The computing assembly of claim 1, wherein the first electronics layer corresponds to a System on a Wafer.

5. The computing assembly of claim 1, wherein the first electronics layer corresponds to an organic substrate panel.

6. The computing assembly of claim 1, wherein the first electronics layer corresponds to a wafer fanout panel.

7. The computing assembly of claim 1, wherein the first electronics layer corresponds to a combination of an organic substrate panel and a silicon interposer.

8. The computing assembly of claim 1, further comprising a control board to provide signaling and control functions.

9. The computing assembly of claim 1, wherein a number of integrated circuit dies in the first electronics layer is equal to a number of power delivery modules in the second electronics layer.

10. The computing assembly of claim 1, wherein power is delivered vertically from the second electronics layer to the first electronics layer.

11. The computing assembly of claim 1, wherein a type of the first cooling system and a type of the second cooling system comprises one or more of a cold plate, a heatsink, and a liquid cooling block.

12. The computing assembly of claim 1, wherein the array of integrated circuit dies includes at least one of an array of three by three integrated dies, an array of four by four integrated dies, an array of five by five integrated dies, or an array of six by six integrated dies.

13. A method for cooling an electronic assembly comprising:

mounting a first cooling system on top of and in thermal communication with a first electronics layer, wherein the first electronics layer includes an array of integrated circuit dies and wherein the first electronics layer includes conductive materials to interconnect the array of integrated circuit dies;

mounting the first electronics layer on top of and in thermal communication with a second cooling system; and mounting the second cooling system on top of and in thermal communication with a second electronics layer, wherein the second electronics layer comprises an array of power delivery modules, each power delivery module of the array of power delivery modules electrically connected with and configured to supply power to a respective integrated circuit die of the array of integrated circuit dies, wherein the second cooling system comprises a first cooling inlet configured to receive a coolant and a first cooling outlet configured to remove the coolant from the second cooling system, and is configured to conduct thermal energy from the array of integrated circuit dies and the array of power delivery modules, and wherein each integrated circuit die of the array of integrated circuit dies is in electronic communication with each other in a plane that is orthogonal to power delivery from the array of power delivery modules.

14. The method of claim 13, further comprising:

outputting heat vertically from the first electronics layer to the first cooling system;

outputting heat vertically from the first electronics layer to the second cooling system; and outputting heat vertically from the second electronics layer to the second cooling system.

15. The method of claim 13, further comprising:

providing power vertically from the second electronics layer to the first electronics layer.

16. A computing assembly comprising:

a first cooling system;

a first electronics layer in thermal communication with the first cooling system;

a second cooling system in thermal communication with the first electronics layer;

a second electronics layer in thermal communication with the second cooling system;

a third cooling system in thermal communication with the second electronics layer; and a third electronics layer in thermal communication with the third cooling system, wherein the first electronics layer comprises a processing electronics layer comprising a plurality of mounted integrated circuit dies and wherein the first electronics layer includes conductive materials to interconnect the plurality of mounted integrated circuit dies, wherein the second electronics layer comprises a power delivery layer comprising an array of power delivery modules wherein the integrated circuit dies of the plurality of mounted integrated circuit dies are in electronic communication with each other in a plane that is orthogonal to power delivery from the array of power delivery modules and wherein each power delivery module of the array of power delivery modules is electrically connected with and configured to supply power to a respective integrated circuit die of the plurality of mounted integrated circuit dies, wherein the second cooling system comprises a first cooling inlet configured to receive a coolant and a first cooling outlet configured to remove the coolant from the second cooling system, and is configured to conduct thermal energy from plurality of mounted integrated circuit dies and the array of power delivery modules, and wherein the third electronics layer comprises a control electronics layer.

17. The computing assembly of claim 16, wherein the first electronics layer corresponds to an organic substrate panel.

18. The computing assembly of claim 16, wherein the first electronics layer corresponds to a wafer fanout panel.

19. The computing assembly of claim 16, wherein the first electronics layer corresponds to a combination of an organic substrate panel and a silicon interposer.

20. The computing assembly of claim 16, wherein the plurality of mounted integrated circuit dies includes an array of integrated circuit dies.

* * * * *